(12) United States Patent
Gandhi et al.

(10) Patent No.: US 11,355,412 B2
(45) Date of Patent: Jun. 7, 2022

(54) STACKED SILICON PACKAGE ASSEMBLY HAVING THERMAL MANAGEMENT

(71) Applicant: Xilinx, Inc., San Jose, CA (US)

(72) Inventors: Jaspreet Singh Gandhi, San Jose, CA (US); Gamal Refai-Ahmed, Santa Clara, CA (US); Henley Liu, San Jose, CA (US); Myongseob Kim, Pleasanton, CA (US); Tien-Yu Lee, San Jose, CA (US); Suresh Ramalingam, Fremont, CA (US); Cheang-Whang Chang, Mountain View, CA (US)

(73) Assignee: XILINX, INC., San Jose, CA (US)

( * ) Notice: Subject to any disclaimer, the term of this patent is extended or adjusted under 35 U.S.C. 154(b) by 327 days.

(21) Appl. No.: 16/147,286

(22) Filed: Sep. 28, 2018

(65) Prior Publication Data

US 2020/0105642 A1 Apr. 2, 2020

(51) Int. Cl.
| | |
|---|---|
| *H01L 23/367* | (2006.01) |
| *H01L 23/427* | (2006.01) |
| *H01L 25/18* | (2006.01) |
| *H01L 25/00* | (2006.01) |
| *H01L 21/48* | (2006.01) |
| *H01L 25/065* | (2006.01) |
| *H01L 25/07* | (2006.01) |

(52) U.S. Cl.
CPC ........ *H01L 23/3675* (2013.01); *H01L 21/481* (2013.01); *H01L 21/4871* (2013.01); *H01L 23/427* (2013.01); *H01L 25/0655* (2013.01); *H01L 25/072* (2013.01); *H01L 25/18* (2013.01); *H01L 25/50* (2013.01); *H01L 2924/165* (2013.01); *H01L 2924/1631* (2013.01); *H01L 2924/1632* (2013.01); *H01L 2924/16251* (2013.01); *H01L 2924/16315* (2013.01)

(58) Field of Classification Search
CPC . H01L 21/481; H01L 12/4871; H01L 23/427; H01L 25/18; H01L 25/50; H01L 23/34; H01L 23/36; H01L 23/367; H01L 23/3675; H01L 23/42; H01L 23/27; H01L 23/433; H01L 2924/16251; H01L 2921/163; H01L 2924/1631; H01L 2924/16315; H01L 2924/1632; H01L 2924/165; H01L 2924/16724; H01L 2924/16747; H01L 25/04; H01L 25/0655; H01L 26/065; H01L 25/07; H01L 25/072
See application file for complete search history.

(56) References Cited

U.S. PATENT DOCUMENTS 5,777,847 A * 7/1998 Tokuno ................... H01L 23/10
257/713
5,886,408 A * 3/1999 Ohki ................. H01L 23/49531
257/720

(Continued)

*Primary Examiner* — Scott B Geyer
(74) *Attorney, Agent, or Firm* — Patterson + Sheridan, LLP

(57) ABSTRACT

A chip package assembly and method for fabricating the same are provided which utilize a plurality of extra-die heat transfer posts for improved thermal management. In one example, a chip package assembly is provided that includes a first integrated circuit (IC) die mounted to a substrate, a cover disposed over the first IC die, and a plurality of extra-die conductive posts disposed between the cover and substrate. The extra-die conductive posts provide a heat transfer path between the cover and substrate that is laterally outward of the first IC die.

18 Claims, 11 Drawing Sheets

(56) References Cited

U.S. PATENT DOCUMENTS

| | | | | |
|---|---|---|---|---|
| 5,990,418 | A * | 11/1999 | Bivona | H01L 23/16 |
| | | | | 174/546 |
| 7,038,316 | B2 * | 5/2006 | Hu | B23K 3/0623 |
| | | | | 257/738 |
| 9,490,198 | B1 * | 11/2016 | Eom | H01L 23/49827 |
| 2002/0050398 | A1 * | 5/2002 | Coico | H01L 21/50 |
| | | | | 174/250 |
| 2004/0212970 | A1 * | 10/2004 | Chen | H01L 24/97 |
| | | | | 361/764 |
| 2006/0027921 | A1 * | 2/2006 | Chiu | H01L 23/4006 |
| | | | | 257/E23.084 |
| 2013/0134574 | A1 * | 5/2013 | Ihara | H01L 23/3675 |
| | | | | 257/706 |
| 2015/0076682 | A1 * | 3/2015 | Wu | H01L 24/97 |
| | | | | 257/693 |
| 2017/0018510 | A1 * | 1/2017 | Shen | H01L 21/561 |
| 2017/0162556 | A1 * | 6/2017 | Lin | H01L 23/24 |
| 2017/0250166 | A1 * | 8/2017 | Cheng | H01L 23/5389 |
| 2017/0372979 | A1 * | 12/2017 | Gandhi | H01L 23/5385 |
| 2020/0098666 | A1 * | 3/2020 | Wan | H01L 23/3128 |
| 2020/0105642 | A1 * | 4/2020 | Gandhi | H01L 25/18 |

\* cited by examiner

US 11,355,412 B2

STACKED SILICON PACKAGE ASSEMBLY HAVING THERMAL MANAGEMENT

TECHNICAL FIELD

Embodiments of the present invention generally relate to a chip package assembly, and in particular, to a chip package assembly comprising at least integrated circuit (IC) die disposed on a package substrate or interposer, and a plurality of extra-die heat transfer posts.

BACKGROUND

Electronic devices, such as tablets, computers, copiers, digital cameras, smart phones, control systems and automated teller machines, among others, often employ electronic components which leverage chip package assemblies for increased functionality and higher component density. Conventional chip packaging schemes often utilize a package substrate, often in conjunction with a through-silicon-via (TSV) interposer, to enable a plurality of integrated circuit (IC) dies to be mounted to a single package substrate. The IC dies may include memory, logic or other IC devices.

In many chip package assemblies, providing adequate thermal management has become increasingly challenging. Failure to provide adequate cooling often results in diminished service life and even device failure. Thermal management is particularly problematic in applications where high band-width memory (HBM) and logic dies such as field programmable gate arrays (FPGA) are integrated in a single package assembly. In such applications, the memory and logic dies may operate at temperatures very close to the thermal junction temperature limit. Thus, small fluctuations in ambient temperatures, such as by air conditioner failure, may quickly lead to the thermal junction temperature limit being exceeded, resulting in device failure or system shutdowns.

Therefore, a need exists for a chip package assembly having improved thermal management.

SUMMARY

A chip package assembly and method for fabricating the same are disclosed herein which utilize a plurality of extra-die heat transfer posts for improved thermal management. In one example, a chip package assembly is provided that includes a first integrated circuit (IC) die mounted to a substrate, a cover disposed over the first IC die, and a plurality of extra-die conductive posts disposed between the cover and substrate. The extra-die conductive posts provide heat transfer paths between the cover and substrate that is laterally outward of the first IC die.

In another example, a chip package assembly is provided that includes a substrate, at least a first memory die mounted to the substrate, at least a first logic die mounted and communicatively coupled to the substrate, a cover disposed over the first memory die and the first logic die, a dielectric material disposed around the first memory die and the first logic die, and a first conductive post. The dielectric material is disposed between the substrate and the cover. The first conductive post is disposed in a hole formed through the dielectric material and provides a heat transfer path between the cover and substrate.

In yet another example, a method for fabricating a chip package assembly is provided. The method includes mounting a first integrated circuit (IC) die to a substrate, forming extra-die thermally conductive posts outward of the first IC die on the substrate, and mounting a cover over the first IC die and the extra-die conductive posts.

In another example, the method for fabricating a chip package assembly may also include forming a hole in a dielectric material disposed around the first IC die, and filling the hole with a bulk thermally conductive layer when forming the extra-die thermally conductive posts.

In another example, the method for fabricating a chip package assembly may also include depositing the extra-die conductive posts on the substrate, and depositing a bulk thermally conductive layer around the extra-die conductive posts and the first IC die when forming the extra-die thermally conductive posts.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

A chip package assembly and method for fabricating the same are provided which utilize a plurality of extra-die heat transfer posts disposed around integrated circuit (IC) dies. The chip package assembly described herein includes at least one integrated circuit (IC) die and cover disposed on a substrate. The substrate may be a package substrate or an interposer. The adjective "extra-die" describes that the posts do not extend through and are laterally outward of the IC die. The extra-die heat transfer posts provide robust heat transfer paths between the cover and the substrate. Although the examples provided herein illustrate the extra-die heat transfer posts disposed between the cover and a substrate in the form of an interposer, the extra-die heat transfer posts may alternatively be disposed between the cover and a substrate in the form of a package substrate in embodiments where an interposer is not utilized. Advantageously, the enhanced heat transfer to the cover of the chip package assembly improves reliability and performance. Furthermore, the extra-die heat transfer posts may be arranged to enhance heat transfer across the entirety of the chip package assembly, for example by using more posts on one region relative to another, thus reducing hot spots which could induce warpage or provide insufficient temperature control of the IC dies. Additionally, the ability of the extra-die heat transfer posts to remove heat from the interposer significantly reduces thermal coupling and temperature rise within the chip packages assembly, which advantageously improves electromigration (EM) lifetime.

Figure 1:
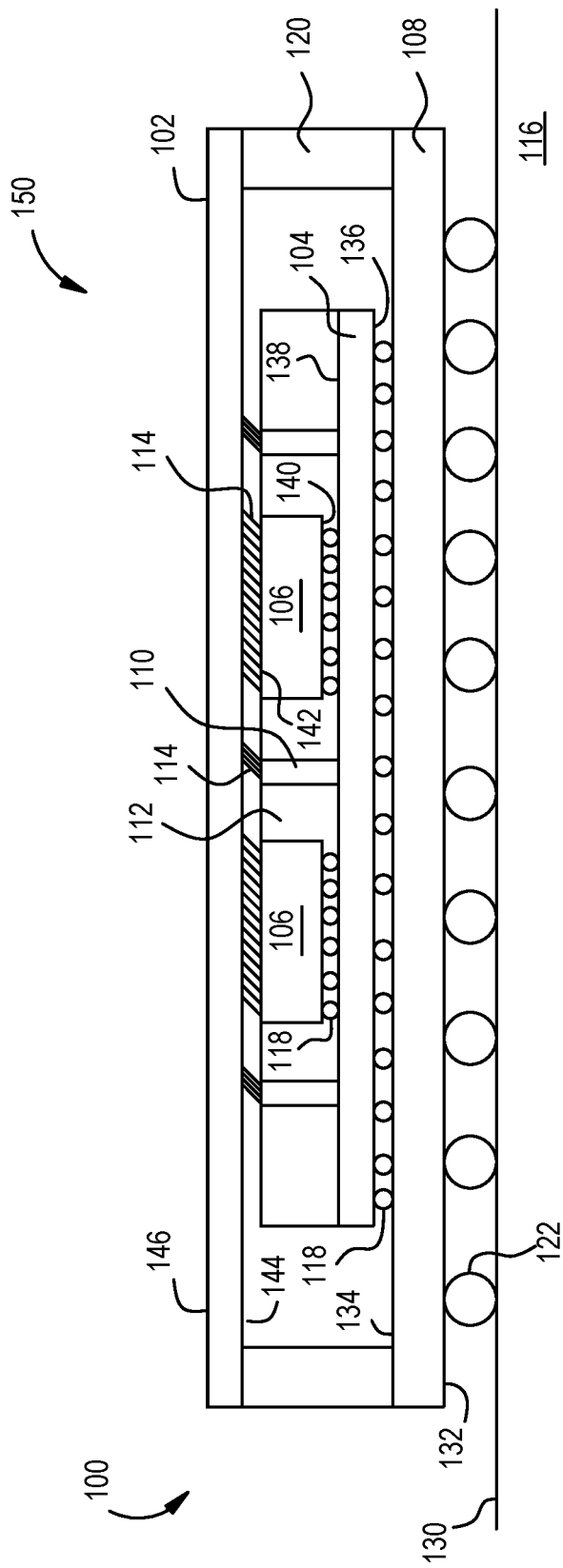
FIG. 1 is a schematic sectional view of the chip package assembly having a plurality of extra-die heat transfer posts disposed around integrated circuit (IC) dies.

Turning now to FIG. 1, a schematic sectional view of a chip package assembly 100 having a plurality of extra-die heat transfer posts 110 disposed around integrated circuit (IC) dies 106 is schematically illustrated. The chip package assembly 100 also includes a cover 102, an interposer 104 and a package substrate 108.

Although two IC dies 106 are shown in FIG. 1, the total number of IC dies may range from two to as many as can be fit within the chip package assembly 100. Examples of IC dies 106 that may be utilized in the chip package assembly 100 include, but are not limited to, programmable logic devices, such as field programmable gate arrays (FPGA), memory devices, such as high band-width memory (HBM), optical devices, processors or other IC logic structures. One or more of the IC dies 106 may optionally include optical devices such as photo-detectors, lasers, optical sources, and the like.

Each die 106 includes a bottom surface 140 and a top surface 142. The bottom surface 140 of the die 106 is coupled to a top surface 138 of the interposer 104 by solder connections 118 or other suitable electrical connection. The top surface 142 of the die 106 faces a bottom surface 144 of the cover 102. Thermal interface material (TIM) 114 is disposed between the top surface 142 of the die 106 the bottom surface 144 of the cover 102 to enhance heat transfer therebetween. In one example, the TIM 114 may be a thermal gel or thermal epoxy, such as, packaging component attach adhesives available from AI Technology, Inc., located in Princeton Junction, N.J.

In some implementations, the cover 102 is fabricated from rigid material. In other implementations particularly where it is desirable to utilize the cover 102 to receive heat from the IC dies 106 and posts 110, the cover 102 is fabricated from a thermally conductive material, such as stainless steel, copper, nickel-plated copper or aluminum, among other suitable materials. A heat sink, not shown, may optionally be mounted to a top surface 146 of the cover 102.

The cover 102 may be structurally coupled to the package substrate 108 to increase the rigidity of the chip package assembly 100. Optionally, a stiffener 120 may be utilized to structurally couple the cover 102 to the package substrate 108. When used, the stiffener 120 may be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, among other materials. The stiffener 120 can also be made of organic materials such as copper-clad laminate.

As discussed above, the IC dies 106 are connected to the circuitry of the interposer 104 through the solder connections 118. The circuitry of the interposer 104 is similarly connected to the circuitry of the package substrate 108. In the example depicted in FIG. 1, a bottom surface 136 of the interposer 104 is electrically and mechanically coupled to a top surface 134 of the package substrate 108 by solder connections 118 or other suitable connection.

The chip package assembly 100 may be mounted to a printed circuit board (PCB) 116 to form an electronic device 150. In this manner, the circuitry of the package substrate 108 is coupled to the circuitry of the package substrate 108 via solder balls 122, or other suitable connection. In the example depicted in FIG. 1, a bottom surface 132 of the package substrate 108 is electrically and mechanically coupled to a top surface 130 of the PCB by the solder balls 122.

Dielectric filler 112 is disposed on the interposer 104 between the dies 106. The dielectric filler 112 provides additional rigidity to the package assembly 100, while also protecting the solder connections 118. The dielectric filler 112 may be an epoxy-based material or other suitable material. The dielectric filler 112 may additionally include fillers, for example, inorganic fillers such as silica ($SiO_2$). In one example, the dielectric filler 112 may have a CTE between about 20 to about 40 ppm/degree Celsius, a viscosity of between about 5 to about 20 Pascal-seconds, and a Young's modulus of between about 6 to about 15 Pascal (Pa).

In one example, the dielectric filler 112, prior to curing, has a viscosity suitable to flow into and fill the interstitial space between the bottom surface 140 of the dies 106 and the top surface 138 of the interposer 104 around the solder connections 118. Alternatively, a separate underfill material may be used to fill the interstitial space the bottom surface 140 of the dies 106 and the top surface 138 of the interposer 104 around the solder connections 118, while the dielectric filler 112 is disposed over the underfill and fills the interstitial space between adjacent dies 106.

The extra-die heat transfer posts 110 extend through the dielectric filler 112 and provide robust conductive heat transfer paths between the top surface 138 of the interposer 104 and the bottom surface 144 of the cover 102. TIM may be utilized between the posts 110 and the cover 102 to provide a robust heat transfer interface between the posts 110 and the bottom surface 144 of the cover 102. The posts 110 generally are formed from thermally conductive material selected to provide good heat transfer between the cover 102 and the interposer 104. The posts 110 may have any suitable sectional profile, and generally have a length that is about the same as the height of the die 106. In one example, the sectional profile of the post 110 is circular. The number, size, density and location of the posts 110 may be selected to provide a desired heat transfer profile between the cover 102 and the interposer 104, for example, to compensate for one die 106 producing more heat than another die 106.

Figure 2:
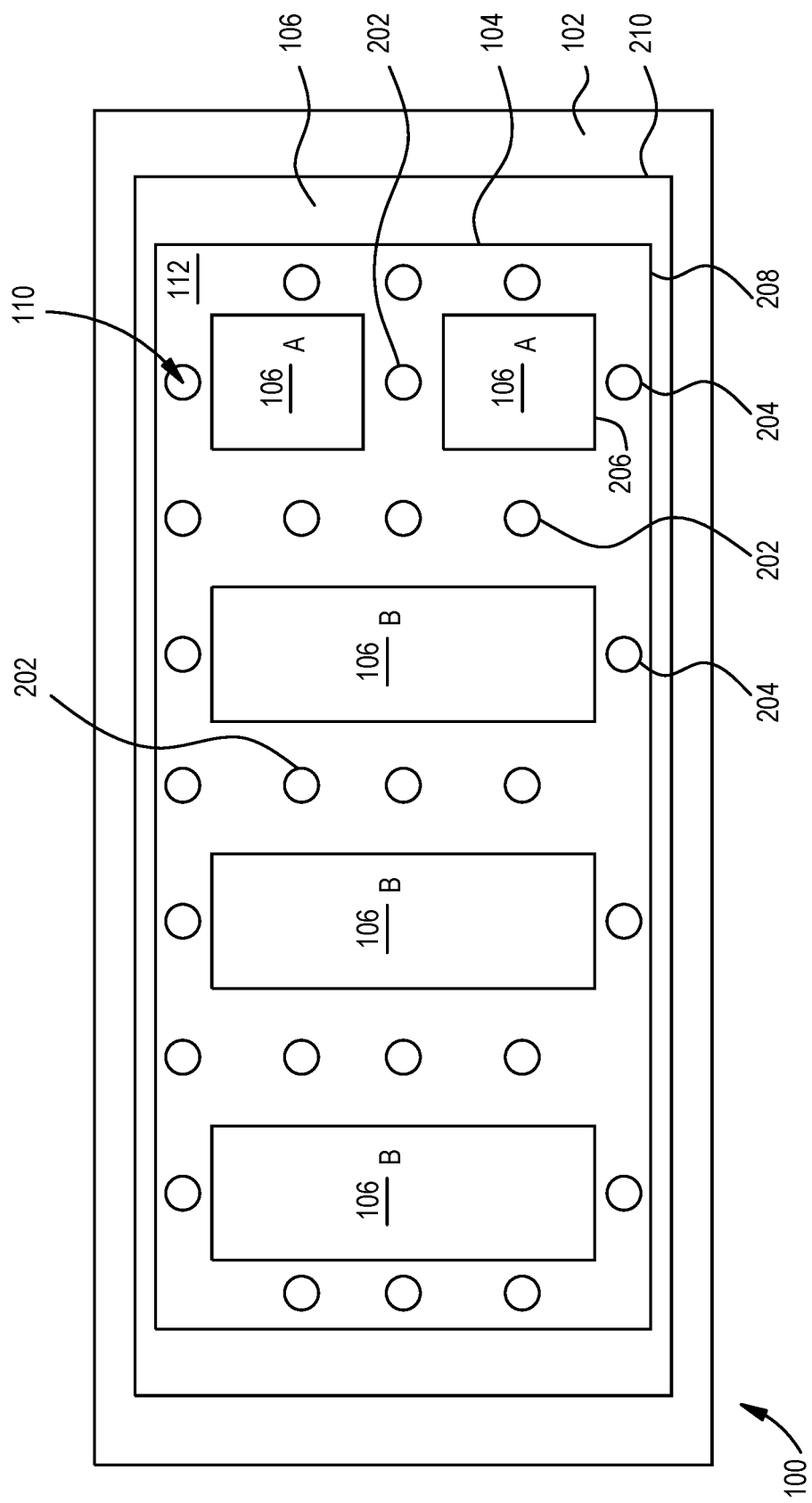
FIG. 2 is a schematic top view of a chip package assembly of FIG. 1 having a cover removed to reveal an exemplary geometric arrangement of the extra-die heat transfer posts disposed around the IC dies.

FIG. 2 is a schematic top view of the chip package assembly 100 of FIG. 1 having the cover 102 removed to reveal an exemplary geometric arrangement of the extra-die heat transfer posts 110 disposed around the IC dies 106. In the example depicted in FIG. 2, the chip package assembly 100 is configured as a high band-width memory (HBM) device, with IC dies 106A configured as field programmable gate arrays (FPGA) and IC dies 1068 configured as HBM dies. It is contemplated that the IC dies comprising the chip package assembly 100 may be the same or different types, including types other than HBM and FPGA dies.

In the example depicted in FIG. 2, the extra-die heat transfer posts 110 includes posts 202 that are disposed between adjacent dies 106A, between adjacent dies 1068, and between adjacent dies 106A and 1068. Additionally, the extra-die heat transfer posts 110 include posts 204 that are disposed between the dies 106A,B and an edge 208 of the interposer 104. Described differently, the posts 204 are disposed outward of the dies 106A,B and inward of an edge 210 of the stiffener 120. The location, size and density of the posts 202, 204 may be selected to enhance heat transfer in desired locations, and to control the warpage of the chip package assembly 100. Additional details of the posts 110 are provided in the exemplary non-limiting examples provided in FIGS. 3-5 further described below.

Figure 3:
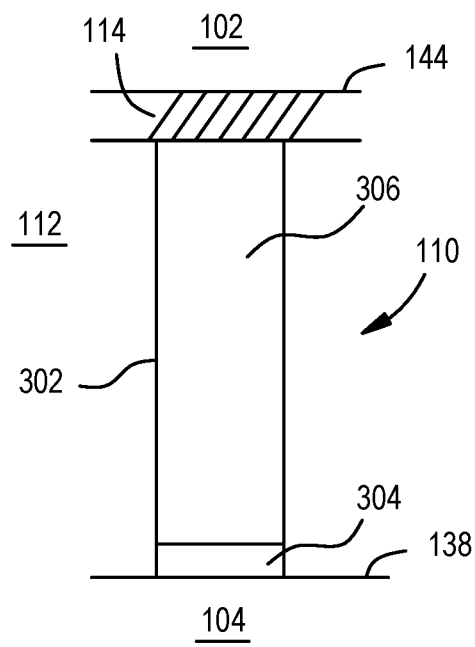
FIG. 3 is a schematic sectional view of an exemplary one of the extra-die heat transfer posts of FIG. 2.

FIG. 3 is a schematic sectional view of one example of the extra-die heat transfer post 110 disposed between the top surface 138 of the interposer 104 and the bottom surface 144 of the cover 102. The post 110 is disposed in a hole 302 extending through the dielectric filler 112. The hole 302 may be formed prior to depositing the post 110 in the dielectric filler 112. For example, the hole 302 may be formed by etching, laser drilling, embossing, thermoforming, mechanical drilling or other suitable method. The hole 302 may alternatively be formed after the post 110 is disposed on the interposer 104. For example, the dielectric filler 112 may be formed around the previously formed post 110, such as by molding of filler 112 around a previously formed post 110 or other suitable technique.

In the embodiment depicted in FIG. 3, the post 110 includes a bulk conductor 306 extending between the interposer 104 and the cover 102. The bulk conductor 306 may be a metal filling or plated within the hole 302. In one example, the bulk conductor 306 is electroless or electroplated copper. The bulk conductor 306 may be formed directly on the top surface 138 of the interposer 104. Optionally, a seed layer 304 may be formed on the top surface 138 of the interposer 104, and the bulk conductor 306 formed by electroplating on the seed layer 304. Use of the seed layer 304 is not required for electroless plating of the bulk conductor 306 within the hole 302. Although not shown, the seed layer 304 may additionally be formed along the sidewalls of the hole 302. Once the bulk conductor 306 is formed in the hole 302, TIM 114 is disposed on the bulk conductor 306 to provide a good heat transfer interface between the post 110 and the cover 102 to advantageously improve the heat transfer performance of the chip package assembly 100.

Figure 4:
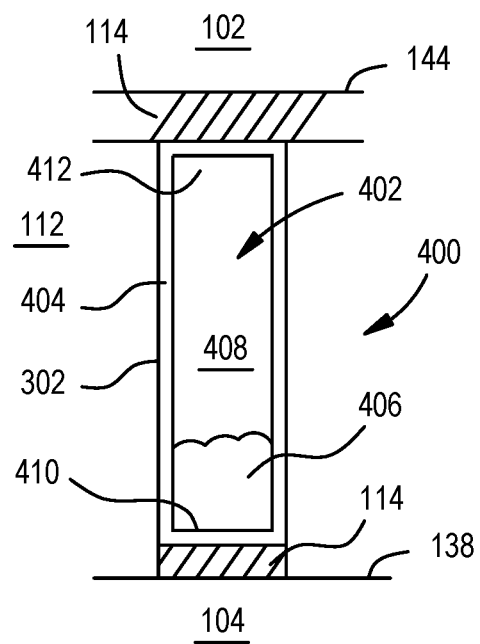
FIGS. 4-5 are schematic sectional views of various alternative embodiments of an extra-die heat transfer post.

FIG. 4 is a schematic sectional view of another example of an extra-die heat transfer post 400 disposed between the top surface 138 of the interposer 104 and the bottom surface 144 of the cover 102. The extra-die post 400 may be utilized to replace any or all of the extra-die posts 110 utilized in the chip package assembly 100.

The extra-die post 400, similar to the extra-die post 110 described above, is disposed in the hole 302 extending through the dielectric filler 112. The extra-die post 400 may be disposed in the hole 302 directly on the top surface 138 of the interposer 104. Optionally, TIM 114, or other thermally conductive adhesive or paste, may be disposed between the post 400 and the top surface 138 of the interposer 104

In the example depicted in FIG. 4, the extra-die post 400 is in the form of an object configured to provide a high rate of heat transfer rate between ends of the object. The high heat transfer rate object uses super thermal conductive properties to move heat between the ends of the object. The high heat transfer rate object can include either (1) vibrating and contacting particles within the object to transfer the heat, such as industrial diamonds, or (2) moving particles within the object by providing two passive flows functionality, such as heat pipes, or (3) moving particles with forced flow movement by introduced fluid circulation within the object which will pumped from external object (i.e. pump outside the package). In the example depicted in FIG. 4, the high heat transfer rate object is shown as a heat pipe 402. The heat pipe 402 includes a sealed tube 404 having a first end 410 and a second end 412. The tube 404 includes a sealed cavity 408 in which a phase change material 406 is disposed. In operation, the phase change material 406 in a liquid phase in contact with a thermally conductive solid surface, i.e., the first end 410 of the tube 404, turns into a vapor by absorbing heat from the interposer 104. The vapor then travels between the first end 410 of the tube 404 inside the cavity 408 to the cold interface, i.e., the second end 412 of the tube 404, and condenses back into a liquid-releasing the latent heat into the cover 102 through the TIM 114. The phase change material 406 in liquid form then returns to the hot interface at the first end 410 of the tube 404 through capillary action and/or gravity, and the cycle repeats. Due to the very high heat transfer coefficients for boiling and condensation, the extra-die post 400 highly effectively and efficiently conducts heat between between the top surface 138 of the interposer 104 and the bottom surface 144 of the cover 102 to advantageously improve the heat transfer performance of the chip package assembly 100.

Figure 5:
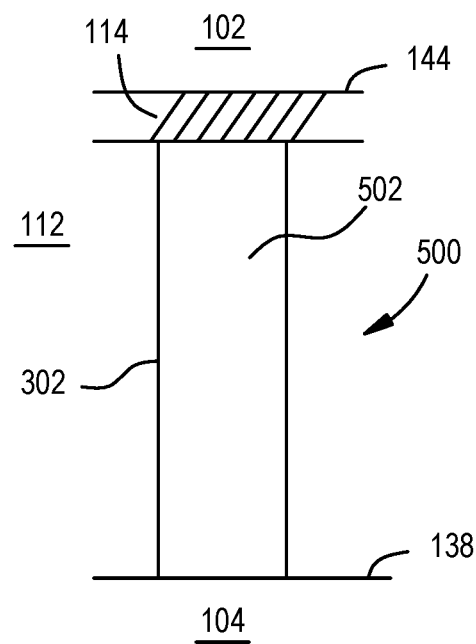

FIG. 5 is a schematic sectional view of another example of an extra-die heat transfer post 500 disposed between the top surface 138 of the interposer 104 and the bottom surface 144 of the cover 102. The extra-die post 500 may be utilized to replace any or all of the extra-die posts 110 utilized in the chip package assembly 100.

The extra-die post 500, similar to the extra-die post 110 described above, is disposed in the hole 302 extending through the dielectric filler 112. The extra-die post 500 may be disposed in the hole 302 directly on the top surface 138 of the interposer 104. Optionally, TIM or other thermally conductive adhesive or paste, may be disposed between the post 500 and the top surface 138 of the interposer 104

In the example depicted in FIG. 5, the extra-die post 500 includes a bulk conductor 502 disposed in the hole 302. The bulk conductor 502 comprises thermally conductive material. The thermally conductive material may be single solid mass, or comprised of multiple elements, such as powder, metal wool, or discrete shapes, among other forms. The thermally conductive material may be solder paste, metal fibers, metal powder, metal particles, metal balls, thermally conductive adhesive or other suitable thermally conductive material. In one example, the bulk conductor 502 is comprised of a plurality of copper balls that fill the hole 302. The interstitial space between the copper balls (or other conductive material filling the hole 302) may be filed TIM or other heat transfer material.

Figure 6:
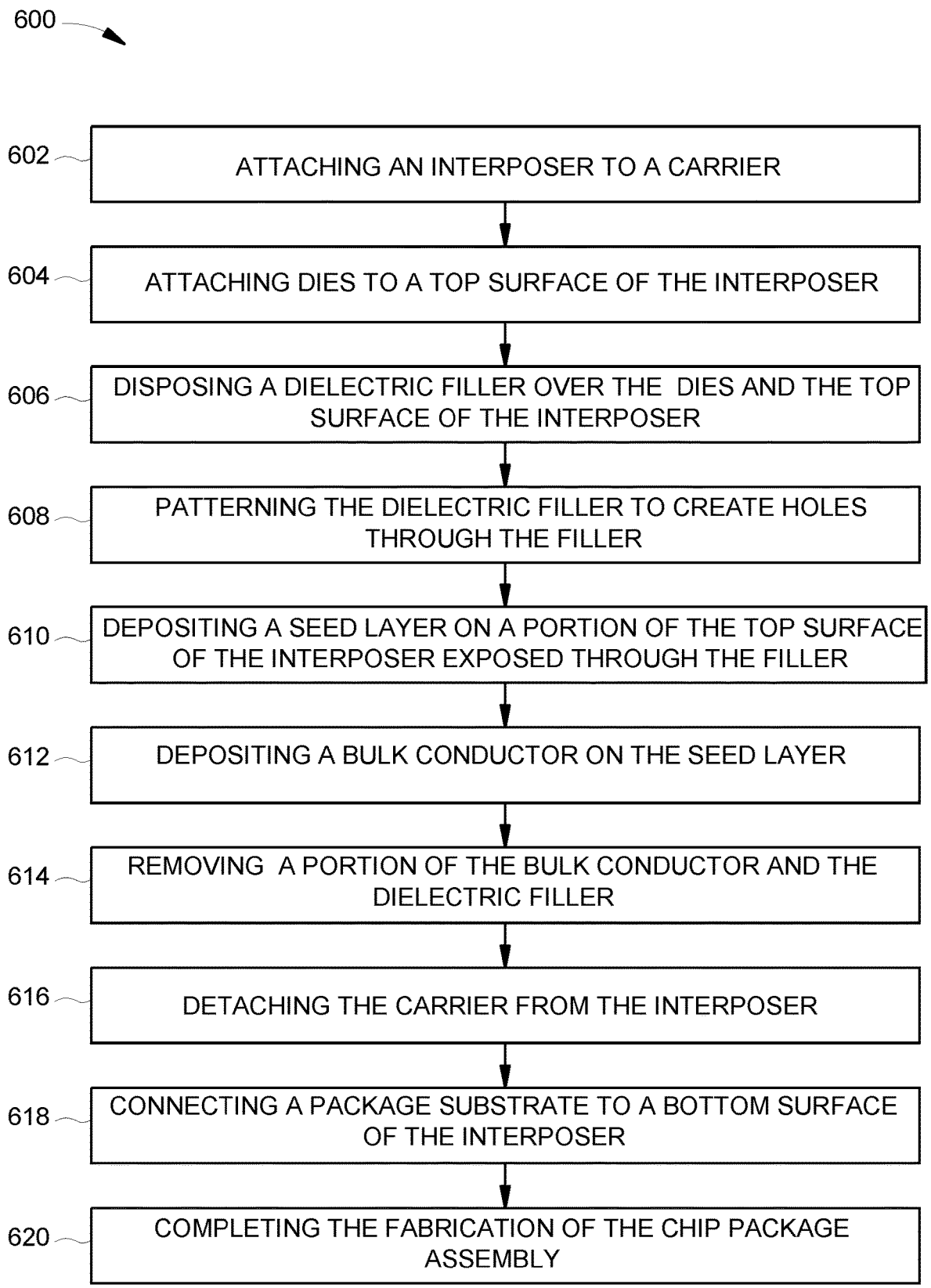
FIG. 6 is a flow diagram of a method for fabricating a chip package assembly having extra-die heat transfer posts.

FIG. 6 is a flow diagram of a method 600 for fabricating a chip package assembly having extra-die heat transfer posts, such as the chip package assembly 100 described above with reference to FIGS. 1-5, and the like. FIGS. 7A-7J are schematic sectional views of a chip package assembly at different stages of the method 600 of FIG. 6.

Figure 7A:
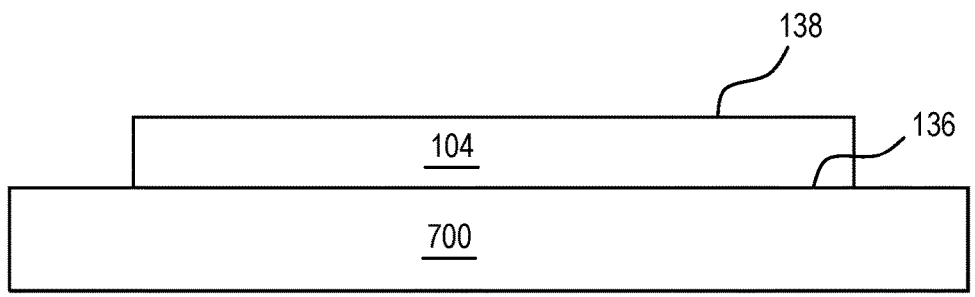
FIGS. 7A-7J are schematic sectional views of a chip package assembly at different stages of the method of FIG. 6.

The method 600 begins at operation 602 by attaching an interposer 104 to a carrier 700, as illustrated in FIG. 7A. The carrier 700 is utilized only during the initial fabrication operations, and as such is removably attached to the bottom surface 136 of the interposer 104. In one example, the interposer 104 is attached to the carrier 700 using releasable pressure sensitive adhesive.

Figure 7B:
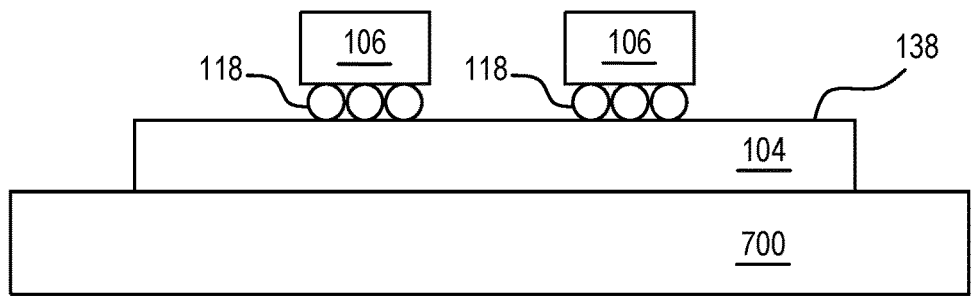

At operation 604, dies 106 are attached to the top surface 138 of the interposer 104, as illustrated in FIG. 7B. During the die attach operation, the solder connections 118 are reflowed to mechanically and electrically attach the circuitry of the dies 106 to the circuitry of the interposer 104.

Figure 7C:
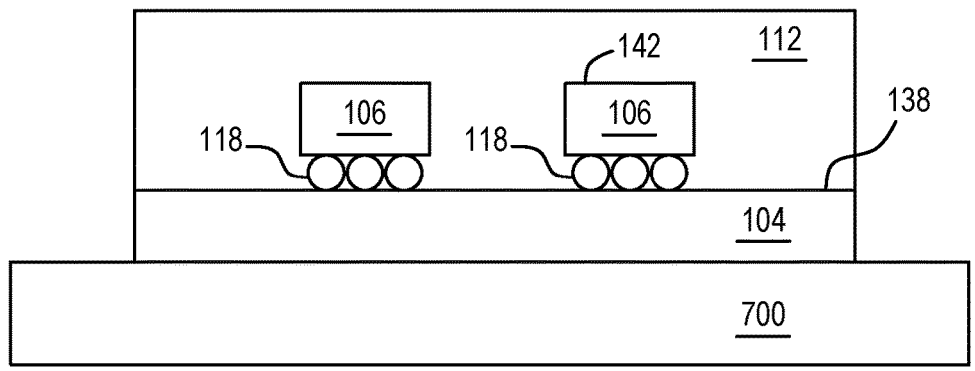

At operation 606, a dielectric filler 112 is disposed over the dies 106 and the top surface 138 of the interposer 104, as illustrated in FIG. 7C. The dielectric filler 112 may be spin on, dispensed, over molded or deposited by another suitable method. At operation 606, the dielectric filler 112 fills the space defined between adjacent dies 106. The dielectric filler 112 also fills the interstitial space defined between the solder connections 118 disposed between the dies 106 and the interposer 104. The dielectric filler 112 generally is disposed to a height greater than the top surface 142 of the dies 106 such that the dies 106 are essentially completely embedded within the filler 112.

Figure 7D:
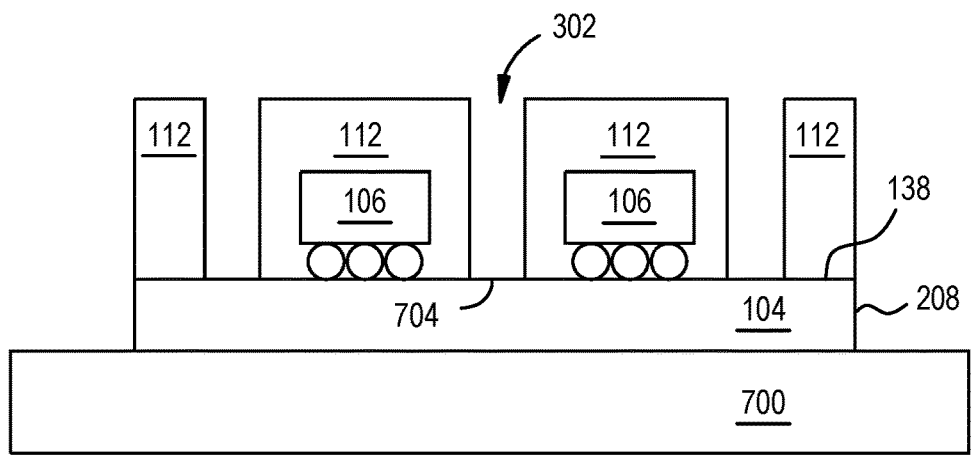

At operation 608, the dielectric filler 112 is patterned to create holes 302 through the filler 112 that exposed a portion 704 of the top surface 138 of the interposer 104, as illustrated in FIG. 7D. The holes 302 may be created by etching the dielectric filler 112, embossing the dielectric filler 112, drilling or machining the dielectric filler 112, laser drilling the dielectric filler 112, or by using another suitable technique. In the example depicted in FIG. 7D, the holes 302 are formed between the dies 106 and between the dies 106 and an edge 208 of the interposer 104 using a laser.

Figure 7E:
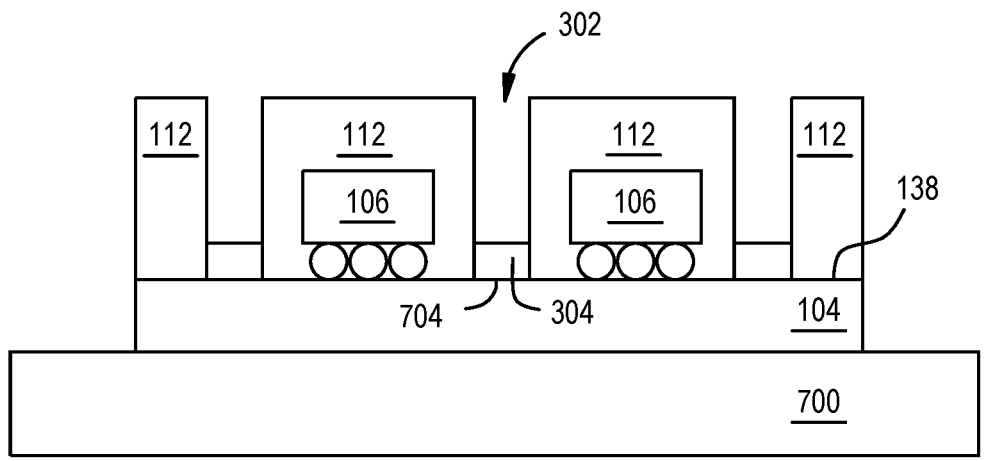

At operation 610, a seed layer 304 is deposited on the portion 704 of the top surface 138 of the interposer 104 exposed through the filler 112, as illustrated in FIG. 7E. The seed layer 304 may be deposited using chemical vaper deposition, physical vapor deposition, inkjet printing or other suitable technique. The seed layer 304 provides an adhesion layer for metal materials subsequently deposited in the hole 302. The seed layer 304 may optionally be deposited on the sidewalls of the hole 302. In the example depicted in FIG. 7E, the seed layer 304 is fabricated from copper.

Figure 7F:
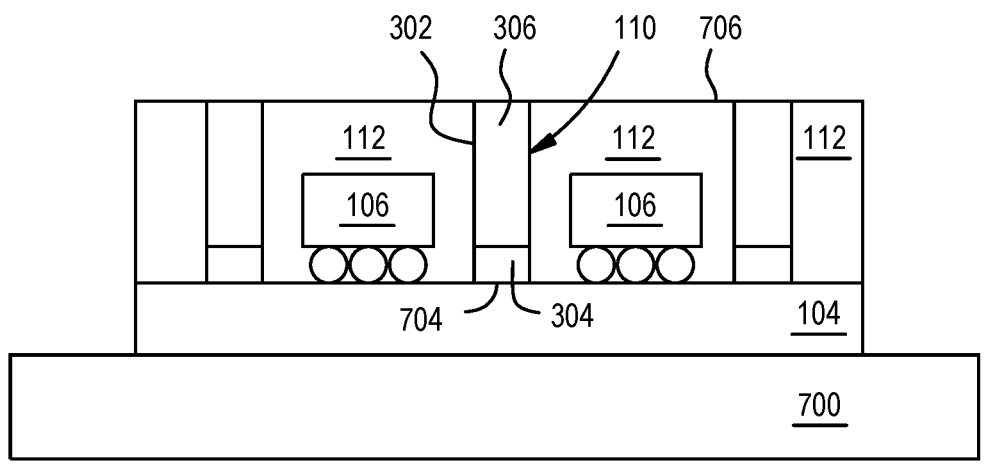

At operation 612, a bulk conductor 306 is deposited on the seed layer 304, as illustrated in FIG. 7F. The bulk conductor 306 may be deposited on the seed layer 304 using electroless plating, electro-plating, chemical vaper deposition, physical vapor deposition, or other suitable technique. The bulk conductor 306 fills the hole 302 completely to a top surface 706 of the dielectric filler 112. In the example depicted in FIG. 7F, the bulk conductor 306 is copper that is plated directly on the seed layer 304.

Figure 7G:
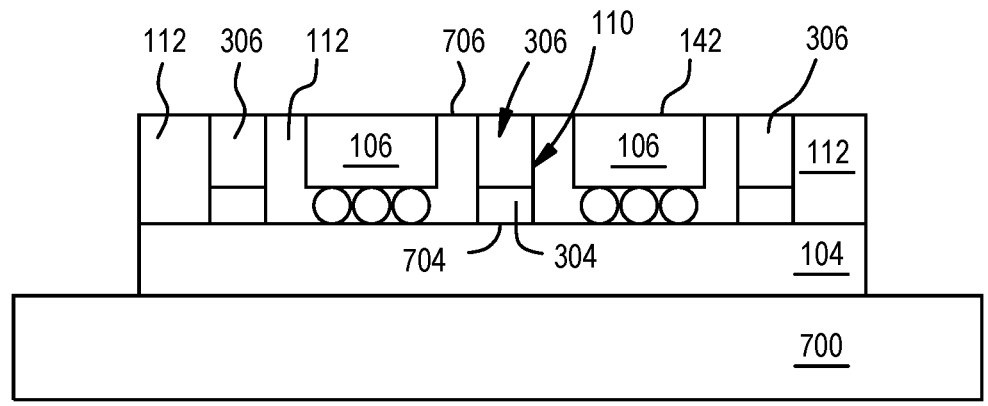

At operation 614, a portion of the bulk conductor 306 and the dielectric filler 112 are removed, as illustrated in FIG. 7G. The removed portion of the bulk conductor 306 and the dielectric filler 112 may be removed by etching, grinding, machining, or other suitable technique. In the example depicted in FIG. 7G, the bulk conductor 306 and the dielectric filler 112 are ground such that the top surface 706 of the dielectric filler 112 (and bulk conductor 306) are essentially coplanar with the top surface 142 of the dies 106 such that the bulk conductor 306 and the seed layer 304 form the conductive post 110. The removal operation 614 may optionally remove a portion of the top surface 142 of the dies 106 to reduce the height of the dies 106.

Alternatively, the seed layer depositing operation 610 may be omitted and a thermally conductive material, such as the material 502 described above, be utilized to fill the hole 302 and form a conductive post 500. In another alternative example, operations 610 and 612 may be omitted and a heat pipe 402 be disposed in the hole 302 to form a conductive post 400.

Figure 7H:
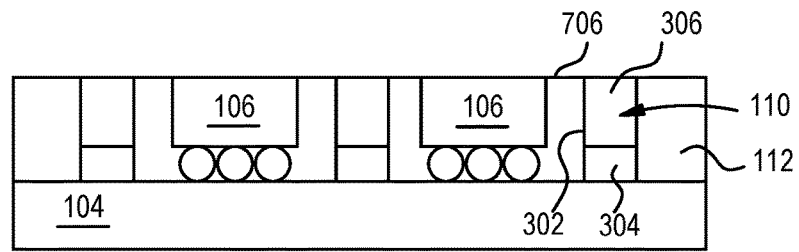
Figure 7I:
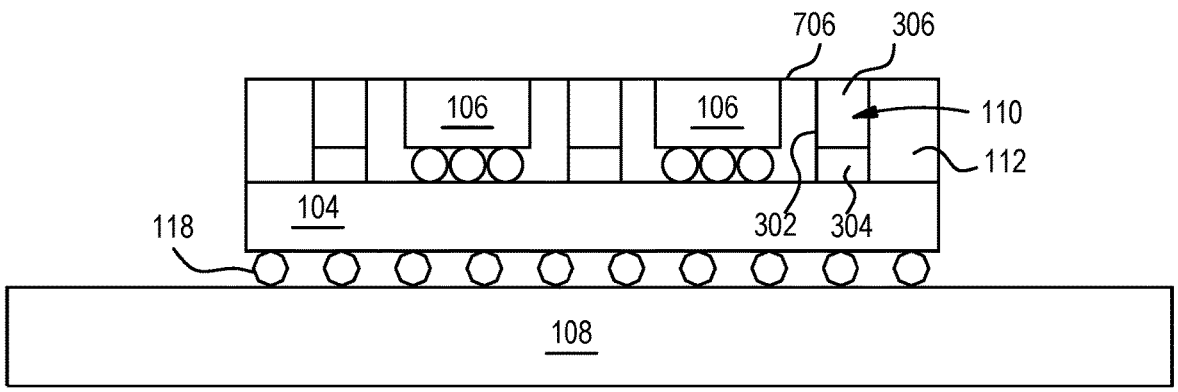

Continuing on to operation 616, the carrier 700 is detached from the interposer 104, as illustrated in FIG. 7H. At operation 618, a package substrate 108 is connected to the bottom surface 136 of the interposer 104, as illustrated in FIG. 7I. During the package substrate to interposer attach operation, the solder connections 118 are reflowed to mechanically and electrically attach the circuitry of the package substrate 108 to the circuitry of the interposer 104.

Figure 7J:
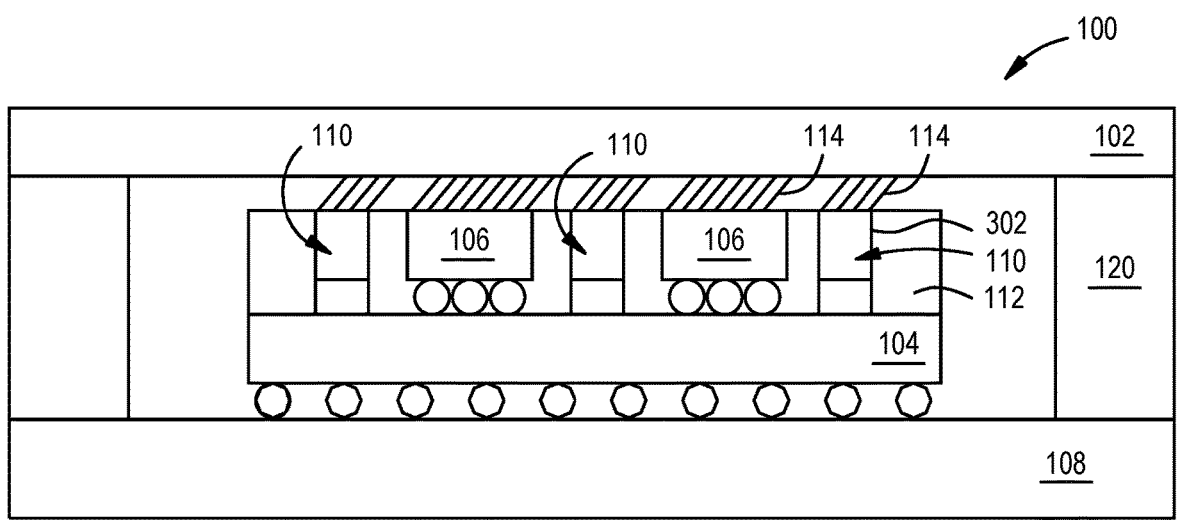

At operation 620, the assembly of the chip package assembly 100 is completed, as illustrated in FIG. 7J. Completing the chip package assembly 100 at operation 620 includes attaching a cover 102 to the package substrate 108 over the dies 106. Operation 620 also include disposing TIM 114 between the extra-die posts 110 and the cover 102 to insure a robust thermal interface between the posts 110 and the cover 102, and accordingly, a robust conductive heat transfer path between the interposer 104 and the cover 102. TIM 114 may additionally be deposed between the cover 102 and the top surface 142 of the die 106.

Figure 8:
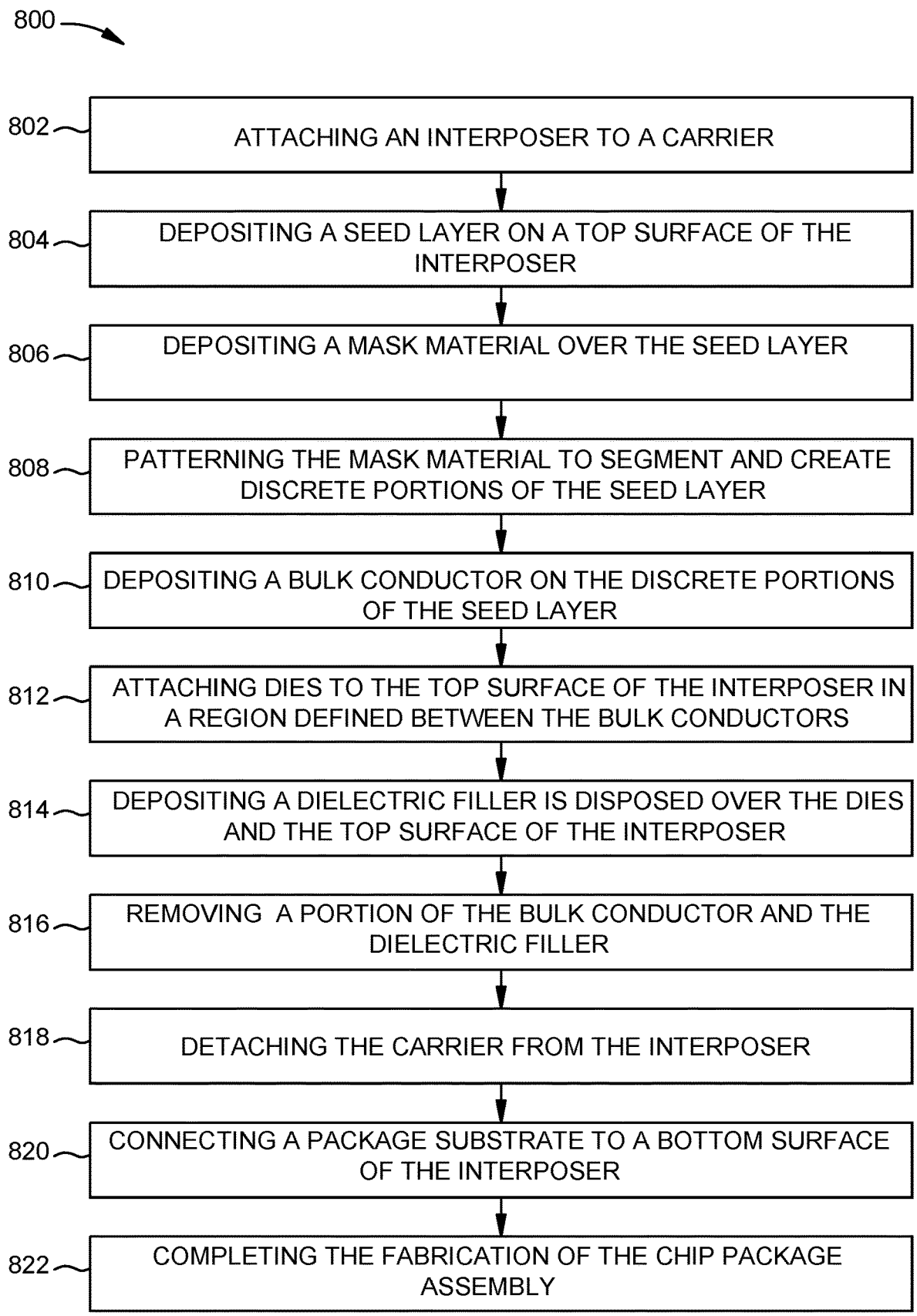
FIG. 8 is a flow diagram of a method for fabricating a chip package assembly having extra-die heat transfer posts.

FIG. 8 is a flow diagram of a method 800 for fabricating a chip package assembly having extra-die heat transfer posts, such as the chip package assembly 100 described above with reference to FIGS. 1-5, and the like. FIGS. 7A-7J are schematic sectional views of a chip package assembly at different stages of the method 800 of FIG. 8.

Figure 9A:
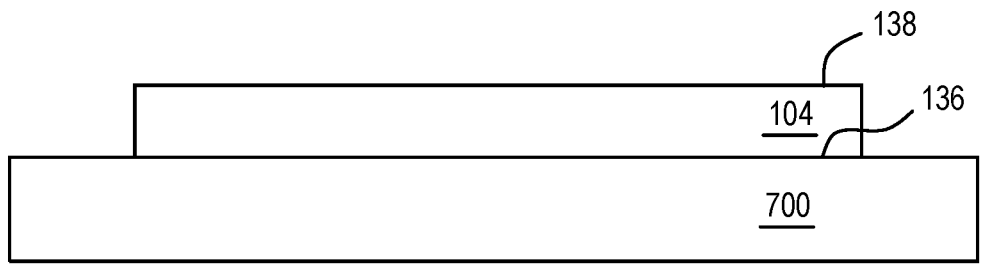
FIGS. 9A-9K are schematic sectional views of a chip package assembly at different stages of the method of FIG. 8.

The method 800 begins at operation 802 by attaching an interposer 104 to a carrier 700, as illustrated in FIG. 9A. The carrier 700 is utilized only during the initial fabrication operations, and as such is removably attached to the bottom surface 136 of the interposer 104. In one example, the interposer 104 is attached to the carrier 700 using releasable pressure sensitive adhesive.

Figure 9B:
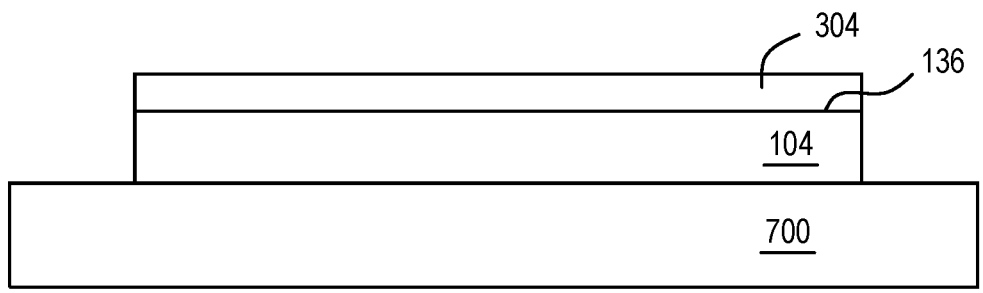

At operation 804, a seed layer 304 is deposited on the top surface 138 of the interposer 104, as illustrated in FIG. 9B. The seed layer 304 may be deposited using chemical vaper deposition, physical vapor deposition, inkjet printing or other suitable technique. The seed layer 304 provides an adhesion layer for metal materials subsequently deposited to form the extra-die post 110, as further described below. In the example depicted in FIG. 9B, the seed layer 304 is fabricated from copper.

Figure 9C:
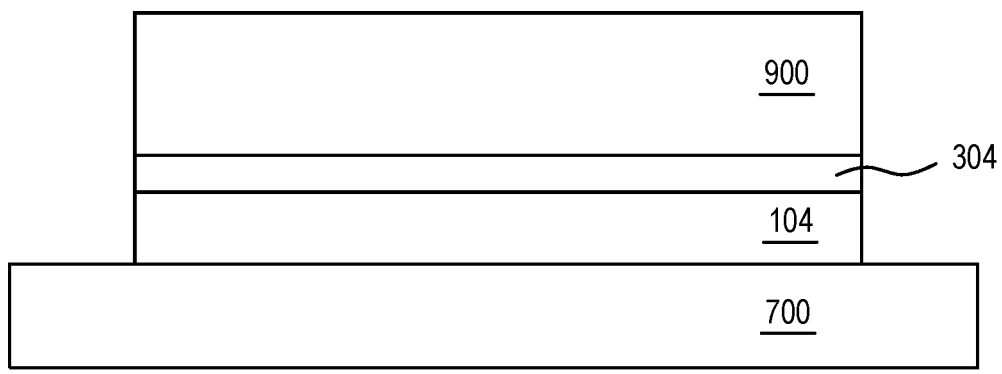

At operation 806, a mask material 900 is deposited over the seed layer 304, as illustrated in FIG. 9C. The mask material 900 may be a photoresist material or other material suitable for patterning and subsequent patterning of the seed layer 304. The mask material 900 may be deposited using spin-on, flowable deposition, chemical vaper deposition, inkjet printing or other suitable technique. In the example depicted in FIG. 9B, the mask material 900 is a polymeric photoresist material.

Figure 9D:
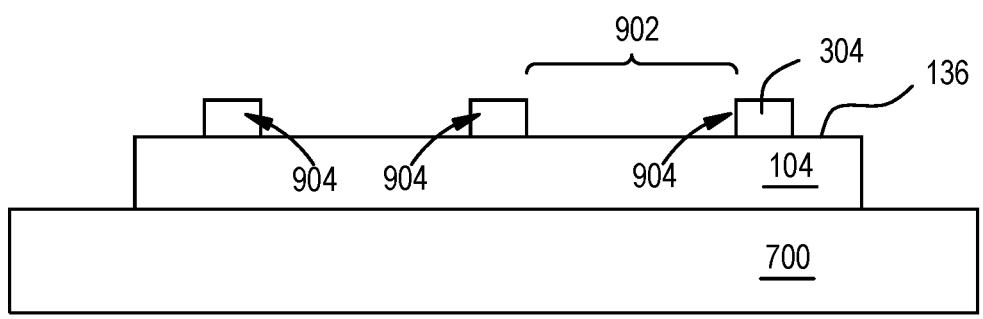

At operation 808, the mask material 900 is patterned and used to segment and create discrete portions 904 of the seed layer 304, as illustrated in FIG. 9D. A Seed layer will be a blanket film on the interposer wafer. Photo-resist mask will be patterned on this film followed by plating. 904 protrusions should be taller as mask material and the region 902 is defined between mask protrusions and not seed layer protrusion. A region 902 is defined between the discrete portions 904 of the seed layer 304 in which the dies 106 are later attached. The mask material 900 and seed layer 304 may be patterned using suitable photolithographic and etching techniques. Alternatively, operation 806 may be optionally omitted and the seed layer 304 be ablated to directly form the discrete portions 904 on the top surface 138 of the interposer 104. In the example, the discrete portions 904 of the seed layer 304 may be formed by laser ablation to remove portions of the seed layer 304 residing in the regions 902.

Figure 9E:
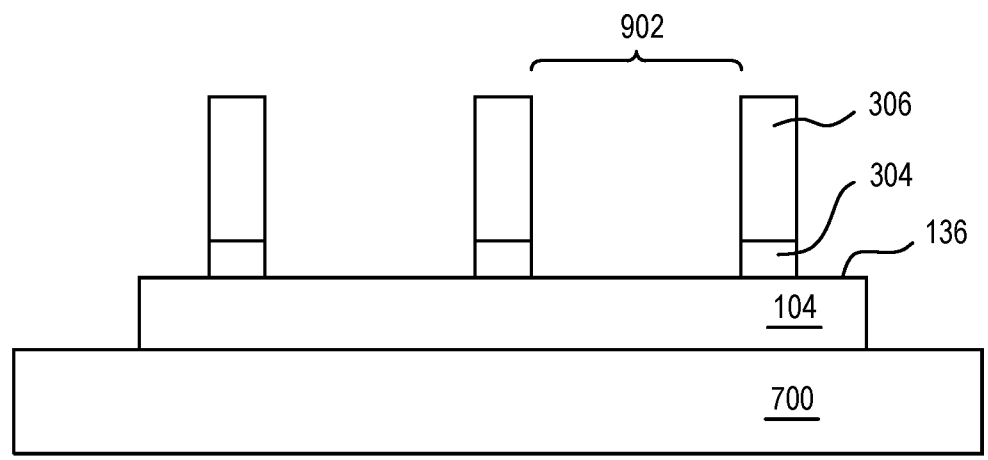

At operation 810, a bulk conductor 306 is deposited on the discrete portions 904 of the seed layer 304, as illustrated in FIG. 9E. The bulk conductor 306 may be deposited on the seed layer 304 using electroless plating, electro-plating, chemical vaper deposition, physical vapor deposition, or other suitable technique. The bulk conductor 306 is formed to a height that is in excess of the height of the dies 106 that will be later attached to the interposer 104 in the region 902. In the example depicted in FIG. 9E, the bulk conductor 306 is copper and is selectively plated directly on the seed layer 304 such that substantially no copper film is deposited in the region 902 and pillars of copper are formed that become the main portion of the conductive posts 110.

Figure 9F:
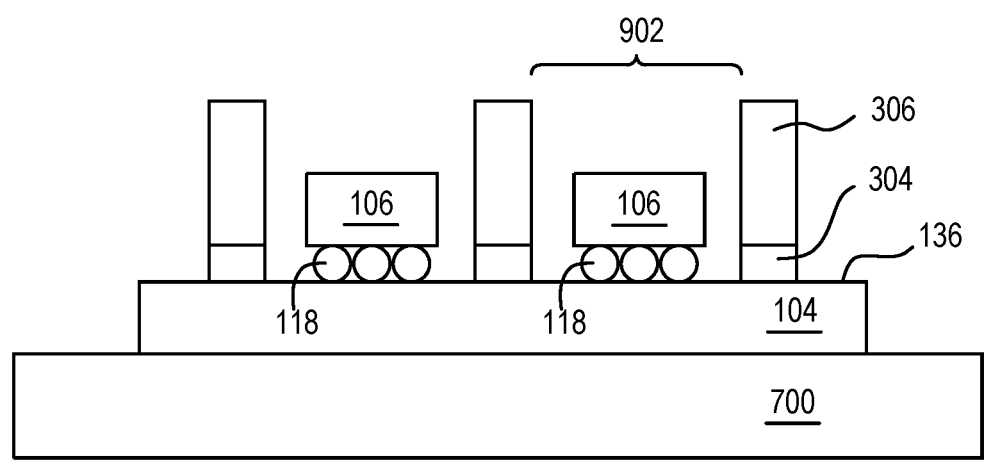

At operation 812, dies 106 are attached to the top surface 138 of the interposer 104 in the region 902 defined between the bulk conductors 306, as illustrated in FIG. 9F. During the die attach operation, the solder connections 118 are reflowed to mechanically and electrically attach the circuitry of the dies 106 to the circuitry of the interposer 104.

Figure 9G:
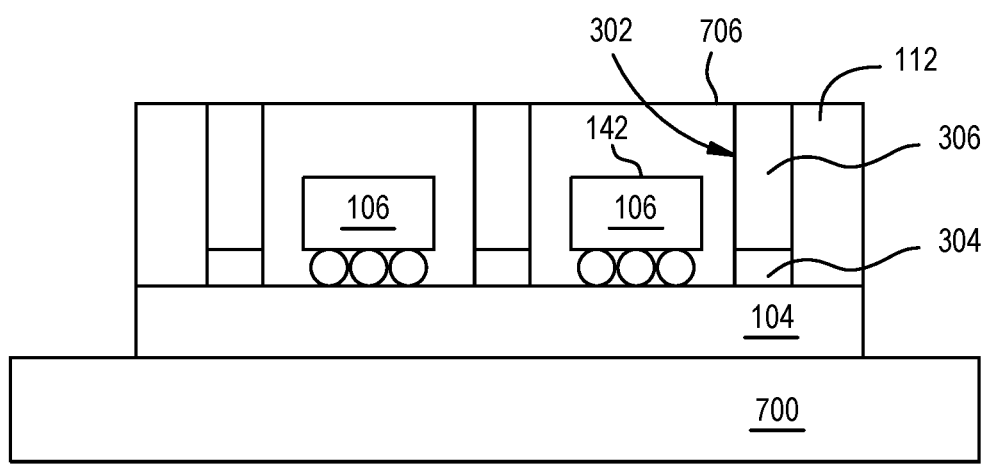

At operation 814, a dielectric filler 112 is disposed over the dies 106 and the top surface 138 of the interposer 104, as illustrated in FIG. 9G. The dielectric filler 112 is formed around the bulk conductors 306 and seed layers 304, such forming a hole 302 in the dielectric filler 112 in which the bulk conductors 306 reside. The dielectric filler 112 may be spin on, dispensed, over molded or deposited by another suitable method. At operation 814, the dielectric filler 112 fills the space defined between adjacent dies 106. The dielectric filler 112 also fills the interstitial space defined between the solder connections 118 disposed between the dies 106 and the interposer 104. The dielectric filler 112 generally is disposed to a height greater than the top surface 142 of the dies 106 such that the dies 106 are essentially completely embedded within the filler 112.

Figure 9H:
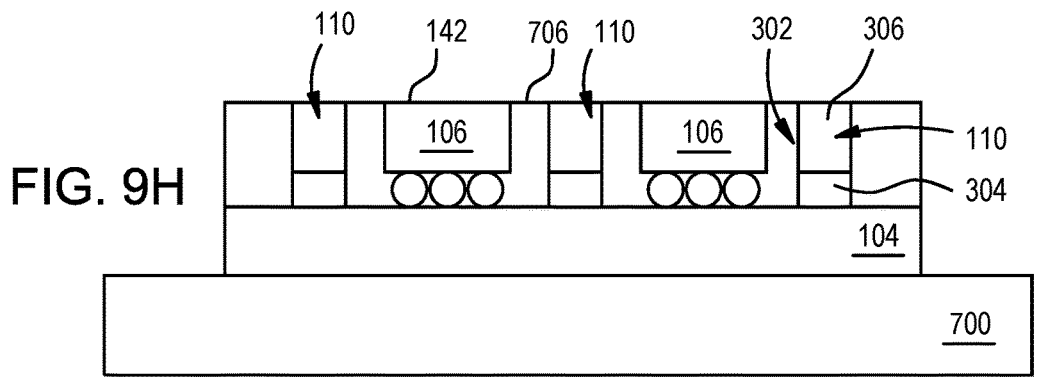

At operation 816, a portion of the bulk conductor 306 and the dielectric filler 112 are removed, as illustrated in FIG. 9H. The removed portion of the bulk conductor 306 and the dielectric filler 112 may be removed by etching, grinding, machining, or other suitable technique. In the example depicted in FIG. 9H, the bulk conductor 306 and the dielectric filler 112 are ground such that the top surface 706 of the dielectric filler 112 (and bulk conductor 306) are essentially coplanar with the top surface 142 of the dies 106 such that the bulk conductor 306 and the seed layer 304 form the conductive post 110. As discussed above, the removal operation 816 may optionally remove a portion of the top surface 142 of the dies 106 to reduce the height of the dies 106.

Figure 9I:
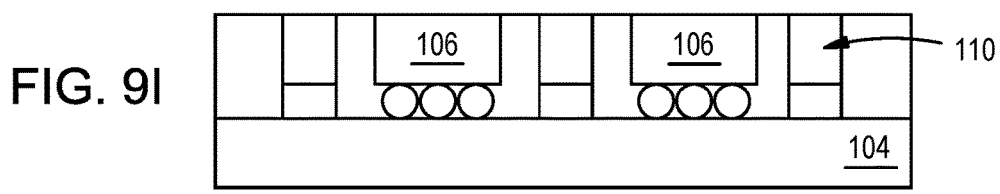
Figure 9J:
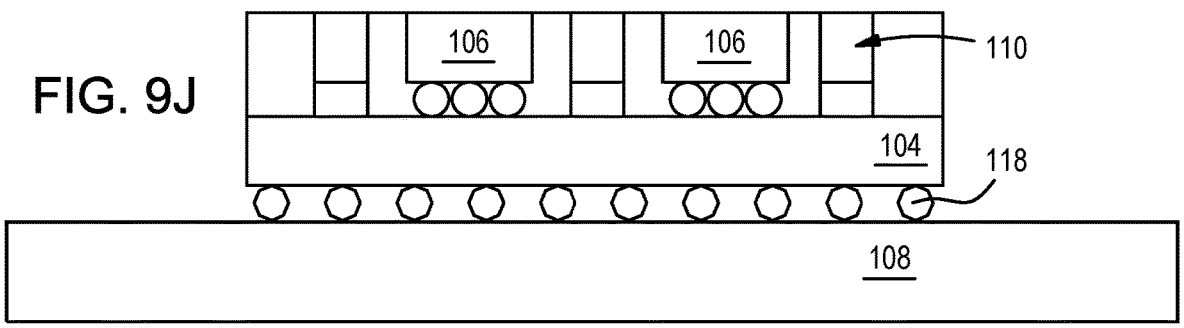

At operation 818, the carrier 700 is detached from the interposer 104, as illustrated in FIG. 9I. At operation 820, a package substrate 108 is connected to the bottom surface 136 of the interposer 104, as illustrated in FIG. 9J. During the package substrate to interposer attach operation, the solder connections 118 are reflowed to mechanically and electrically attach the circuitry of the package substrate 108 to the circuitry of the interposer 104.

Figure 9K:
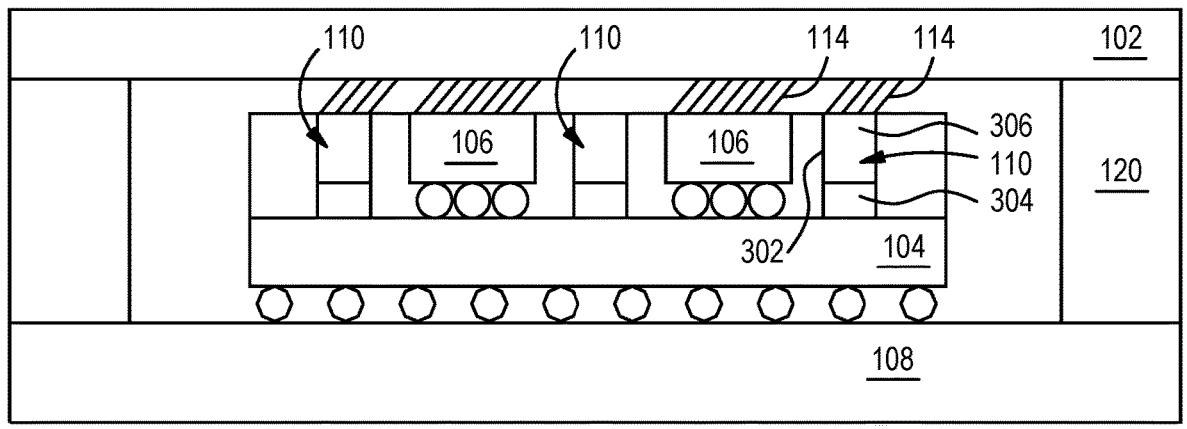

At operation 822, the assembly of the chip package assembly 100 is completed, as illustrated in FIG. 9K. Operation 822 is similar to operation 620 described above. Completing the chip package assembly 100 at operation 822 includes attaching a cover 102 to the package substrate 108 over the dies 106. Operation 822 also include disposing TIM 114 between the extra-die posts 110 and the cover 102 to insure a robust thermal interface between the posts 110 and the cover 102, and accordingly, a robust heat transfer path between the interposer 104 and the cover 102. TIM 114 may additionally be deposited between the cover 102 and the top surface 142 of the die 106.

Thus, a chip package assembly and method for fabricating the same have been provided which utilize a plurality of extra-die heat transfer posts disposed around integrated circuit (IC) dies to improve heat transfer vertically within the chip package assembly. The extra-die heat transfer posts advantageously provide robust conductive heat transfer paths between a cover and a substrate, such as an interposer or package substrate. The extra-die heat transfer posts can also be selectively positioned to improve the heat transfer profile across the package assembly. The enhanced heat transfer to the cover of the chip package assembly significantly improves reliability and performance, while also reducing hot spots which could induce warpage or provide insufficient temperature control of the IC dies. Additionally, the ability of the extra-die heat transfer posts to remove heat from the interposer significantly reduces thermal coupling and temperature rise within the chip packages assembly, which advantageously improves electromigration (EM) lifetime.

While the foregoing is directed to embodiments of the present invention, other and further embodiments of the invention may be devised without departing from the basic scope thereof, and the scope thereof is determined by the claims that follow.

What is claimed is:

1. A chip package assembly comprising:
   a substrate;
   a first integrated circuit (IC) die mounted to the substrate;
   a cover disposed over the first IC die; and
   a plurality of extra-die conductive posts disposed between the cover and substrate, the plurality of extra-die conductive posts providing a heat transfer path between the cover and the substrate that is laterally outward of the first IC die, wherein the plurality of extra-die conductive posts further comprises:
   a seed layer disposed on the substrate; and
   a bulk thermally conductive layer disposed on the seed layer.

2. The chip package assembly of claim 1 further comprising:
   a dielectric filler disposed between the substrate and the cover disposed over the first IC die, the dielectric filler having a plurality of holes in which the plurality of extra-die conductive posts are disposed.

3. The chip package assembly of claim 2, wherein a first conductive post of the plurality of extra-die conductive posts further comprises:
   a heat pipe having a first end exposed through a first hole of the plurality of holes and in conductive thermal contact with the cover, the heat pipe having a second end exposed through the first hole and in conductive thermal contact with the substrate.

4. The chip package assembly of claim 3 wherein the heat pipe comprises a phase changing material in a sealed cavity of the heat pipe.

5. The chip package assembly of claim 1 further comprising:
   a second IC die mounted to the substrate, the second IC die configured as a memory die and the first IC die configured as a logic die.

6. The chip package assembly of claim 5 further comprising:
   a stiffener bonded to the substrate and circumscribing the first and second IC dies.

7. The chip package assembly of claim 6, wherein at least a first conductive post of the plurality of extra-die conductive posts is disposed between one of the first and second IC dies and the stiffener.

8. The chip package assembly of claim 7, wherein at least a second conductive post of the plurality of extra-die conductive posts is disposed between the first and second IC dies.

9. The chip package assembly of claim 1, wherein a first conductive post of the plurality of extra-die conductive posts comprises a thermally conductive material selected from a group consisting of solder paste, metal fibers, metal powder, metal particles, metal balls, and thermally conductive adhesive.

10. A high bandwidth memory chip package assembly comprising:
   a substrate;
   at least a first memory die mounted to the substrate;
   at least a first logic die mounted to and communicatively coupled to the substrate;
   a cover disposed over the first memory die and the first logic die;
   a dielectric filler disposed around the first memory die and the first logic die, the dielectric filler disposed between the substrate and the cover, the dielectric filler having at least one hole; and
   a first conductive post disposed in the hole in the dielectric filler and providing a heat transfer path between the cover and substrate, wherein the plurality of extra-die conductive posts further comprises:
   a seed layer disposed on the substrate; and
   a bulk thermally conductive layer disposed on the seed layer.

11. The high bandwidth memory chip package assembly of claim 10 further comprising:
   a stiffener bonded to the substrate and circumscribing the first memory die and the first logic die.

12. The high bandwidth memory chip package assembly of claim 11, wherein the first conductive post is disposed between the first memory die and the first logic die.

13. The high bandwidth memory chip package assembly of claim 11, wherein the first conductive post is disposed between (1) the first memory die and the first logic die and (2) the stiffener.

14. The high bandwidth memory chip package assembly of claim 10, wherein the first conductive post further comprises:
   a heat pipe having a first end exposed through the at least one hole and in conductive thermal contact with the cover, the heat pipe having a second end exposed through the at least one hole and in conductive thermal contact with the substrate.

15. The high bandwidth memory chip package assembly of claim 14 wherein the heat pipe comprises a phase changing material in a sealed cavity of the heat pipe.

16. The high bandwidth memory chip package assembly of claim 10, wherein the first conductive post comprises a thermally conductive material comprised of powder, metal wool, or discrete shapes.

17. A chip package assembly comprising:
   a substrate;
   a first integrated circuit (IC) die mounted to the substrate;
   a cover disposed over the first IC die;
   a dielectric filler disposed between the substrate and the cover; and
   a plurality of extra-die conductive material disposed in and extending from the substrate through the dielectric filler, wherein the plurality of extra-die conductive posts further comprises:
   a seed layer disposed on the substrate; and
   a bulk thermally conductive layer disposed on the seed layer.

18. The chip package assembly of claim 17, wherein each of the plurality of extra-die conductive material comprises at least one of powder, metal wool, discrete shapes, solder paste, metal fibers, metal powder, metal particles, metal balls, and thermally conductive adhesive.

* * * * *